United States Patent
Chien (10) Patent No.: US 10,388,677 B2
(45) Date of Patent: Aug. 20, 2019

(54) DISPLAY PANEL AND DISPLAY DEVICE

(71) Applicants: HKC Corporation Limited, Shenzhen (CN); Chongqing HKC Optoelectronics Technology Co., ltd., Chongqing (CN)

(72) Inventor: Chung-Kuang Chien, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/848,364

(22) Filed: Dec. 20, 2017

(65) Prior Publication Data
US 2018/0329243 A1   Nov. 15, 2018

Related U.S. Application Data

(63) Continuation of application No. PCT/CN2017/089181, filed on Jun. 20, 2017.

(30) Foreign Application Priority Data

May 9, 2017   (CN) .......................... 2017 1 0321258

(51) Int. Cl.
*H01L 27/15*   (2006.01)
*H01L 21/00*   (2006.01)
*H01L 27/12*   (2006.01)
*G02F 1/1362*  (2006.01)

(52) U.S. Cl.
CPC ...... *H01L 27/124* (2013.01); *G02F 1/136286* (2013.01); *H01L 27/1288* (2013.01)

(58) Field of Classification Search
CPC ........................................................ H01L 27/124
USPC ............................................... 438/30; 257/86
See application file for complete search history.

(56) References Cited

U.S. PATENT DOCUMENTS

| | | | |
|---|---|---|---|
| 9,239,502 B2 * | 1/2016 | Huang | G02F 1/13458 349/138 |
| 9,335,597 B2 * | 5/2016 | Cai | G02F 1/1345 |
| 9,632,375 B2 * | 4/2017 | Chen | G02F 1/136227 |
| 9,934,723 B2 * | 4/2018 | Lee | G09G 3/3233 |

* cited by examiner

*Primary Examiner* — Calvin Lee
(74) *Attorney, Agent, or Firm* — WPAT, PC (57) ABSTRACT

A display panel is provided. The display panel includes a substrate, active switches disposed on the substrate; the active switches are disposed with metallic wires and the active switches are connected with the metallic wires. The metallic wires are disposed with a blocker; the blocker is configured to block particles from dropping on the metallic wires in the process of manufacturing display panels.

15 Claims, 7 Drawing Sheets

DISPLAY PANEL AND DISPLAY DEVICE

FIELD OF THE DISCLOSURE

The disclosure relates to a display technical field, and more particularly to a display panel and a display device.

BACKGROUND

Liquid crystal displays are widely applied due to numerous advantages such as thin bodies, energy saving, radiation-free, etc. Most liquid crystal displays available on the market are backlight-type liquid crystal displays, and such liquid crystal display includes a display panel and a backlight module. The working principle of the display panel is placing liquid crystal molecules between two parallel substrates, and loading a driving voltage on the two substrates to control rotation directions of the liquid crystal molecules, for refracting rays of the backlight module to generate images.

A thin film transistor-liquid crystal display (TFT-LCD) gradually occupies the dominant position in the display realm at present because of its properties such as low energy consumption, superior image quality and relatively high production yield, etc. Identically, the TFT-LCD includes a display panel and a backlight module. The liquid crystal panel includes a color filter (CF) substrate and a thin film transistor (TFT) substrate. The opposite internal sides of the substrates have transparent electrodes. A layer of liquid crystal (LC) molecules are interposed between the two substrates. The display panel alters the polarization state of light by control of the electric field on the orientation of liquid crystal molecules, and achieves the objective of display by blocking or unblocking the optical path by a polarizer.

In the process of manufacturing panels, particles can be dropped on metallic wires to be flaws of the metallic wires, which may not be wholly picked out in the production line, and the problem of complaints from clients frequently occurs.

SUMMARY

The disclosure provides a display panel to prevent flaws of the metallic wires.

The purpose of the disclosure is achieved by following embodiments.

A display panel includes a substrate and active switches disposed on the substrate.

The active switches are disposed with metallic wires and the active switches are connected with the metallic wires. The metallic wires are disposed with a blocker; the blocker is configured to block particles from dropping on the metallic wires in the process of manufacturing display panels.

Each of the active switches includes a source electrode. The metallic wires include a data line. The data line and the source electrode are connected. The blocker is disposed on the data line. In this way, the data line can be protected effectively by preventing particles from dropping on the metallic wires in manufacturing the display panel or after aligning the display panel, further avoiding flaws or displacement of the data line caused by particles during pressing the panel. As a result, the ratio of appearances of flaws or displacement of the data line can be significantly decreased and problems such as dark spots on the display panel due to the inferior data line can be effectively precluded. The quality of the display panel can be improved to ensure better display effects of the display panel. The enhanced yield of the display panels can reduce the risk of complaints from clients and promote the competitive strength of the display panel on the market.

The blocker is disposed to be closely clung to an upper surface of the data line. In this way, an end of the blocker contacted with the upper surface of the data line thoroughly covers the upper surface of the data line to prevent the poor display effect caused by particles dropped on the data line. The excellent protection can prevent the data line from being damaged in subsequent processes and further raise the yield of the display panels to guarantee the quality of the display panel. As a result, the risk of complaints from clients can be reduced and the competitive strength of the display panel on the market can be improved effectively.

Each of the active switches includes a drain electrode. The metallic wires include a pixel line. The pixel line and the source electrode are connected. The blocker is disposed on the data line. In this way, the pixel line can be protected effectively by preventing particles dropped on the pixel line from being pressed out. Not only can avoid the poor display effect caused by particles dropped on the pixel line, but the excellent protection acts to prevent the data line from being damaged in subsequent processes and further raise the yield of the display panels to guarantee the better display effect of the display panel. As a result, the risk of complaints from clients can be reduced and the competitive strength of the display panel on the market can be improved effectively.

The blocker is disposed to be closely clung to an upper surface of the pixel line, and the blocker is disposed along an edge of the pixel line. In this way, the block is disposed to surround the pixel line to effectively block the particles and reduce a ratio of particles dropped in a liquid crystal cell for ensuring proper and efficient operation of the liquid crystal, and the height of the blocker is greater than the height of the particles for preventing flaws or displacement of the pixel line due to the particles during pressing the panel. The ratios of flaws or displacement of the pixel line can be reduced and the display quality of the display panel is improved efficiently for guaranteeing the better display effect of the display panel.

The substrate includes a first substrate and a second substrate. The active switches are disposed on the first substrate. The second substrate is disposed with a color photoresist layer and a black matrix. The black matrix is disposed at two ends of the color photoresist layer. In this way, the disposition of the black matrix 122 can effectively prevent light leakage and cross color of the color photoresist layer 121, and the display panel can display splendidly. The color saturation of the display panel is improved to further enhance the display effect of the display panel. The black matrix 122 is disposed on two ends of the color photoresist layer 121 to shade the rays of the color photoresist layer. The light leakage of the display panel can be prevented to ensure the better display effect of the display panel.

The metallic wires include a driving line. The driving line and the pixel line are matched with each other. The driving line is disposed on the color photoresist layer. The blocker is disposed on the driving line. In this way, the driving line can be effectively protected by preventing particles dropped on the driving line from being pressed out. Not only can avoid the poor display effect caused by particles dropped on the driving line, but the excellent protection acts to prevent the driving line from being damaged in subsequent processes and further raise the yield of the display panels to guarantee the better display effect of the display panel. As a result, the risk of complaints from clients can be reduced and the competitive strength of the display panel on the market can be improved effectively.

The two ends of the color photoresist layer are disposed to be attached to the black matrix to form a first convex platform and a second convex platform. In this way, as the first convex platform and the second convex platform have the function of separation, the disposition of the blocker on the first convex platform and/or the second convex platform can further improve the separation effect and effectively prevent particles dropped in the liquid crystal cell; so that the display effect of the liquid crystal panel can be assured. The risk of complaints from clients is reduced and the competitive strength of the display panel on the market is promoted.

A spacer is disposed between the first substrate and the second substrate. The spacer supports the first substrate and the second substrate. The spacer and the blocker are both made out of photoreaction materials. The spacer and the blocker adopt an identical photomask. In this way, the manufacturing process of the display panel can be simplified by producing the spacer and the blocker simultaneously. The production of the display panel can be more convenient. The mere improvement in the conventional photomask for producing the spacer is enough for producing the blocker and the spacer with similar costs simply and conveniently, and the quality of the display panel can be improved.

According to another aspect of the disclosure, the disclosure further discloses a display device. The display device includes the display panel described above.

As the disposition of the blocker, the disclosure can effectively prevent particles dropped on the metallic wires in the manufacturing process of display panels, better in preventing the particles dropped on the metallic wires from being pressed out. The height of the blocker is greater than the height of the particles for preventing flaws or displacement of the metallic wires due to the particles during pressing the panel. The ratios of flaws or displacement of the metallic wires can be reduced and the display quality of the display panel is efficiently improved for guaranteeing the better display effect of the display panel; a cross-section of the blocker is disposed to be trapeziform or triangular to enable the particles to roll away from the metallic wires along a side of the blocker. The metallic wires are protected and the yield of the display panels is further raised. The risk of complaints from clients can be reduced and the competitive strength of the display panel on the market can be improved effectively.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described with reference to accompanying drawings and preferred embodiments as follows.

Figure 1:
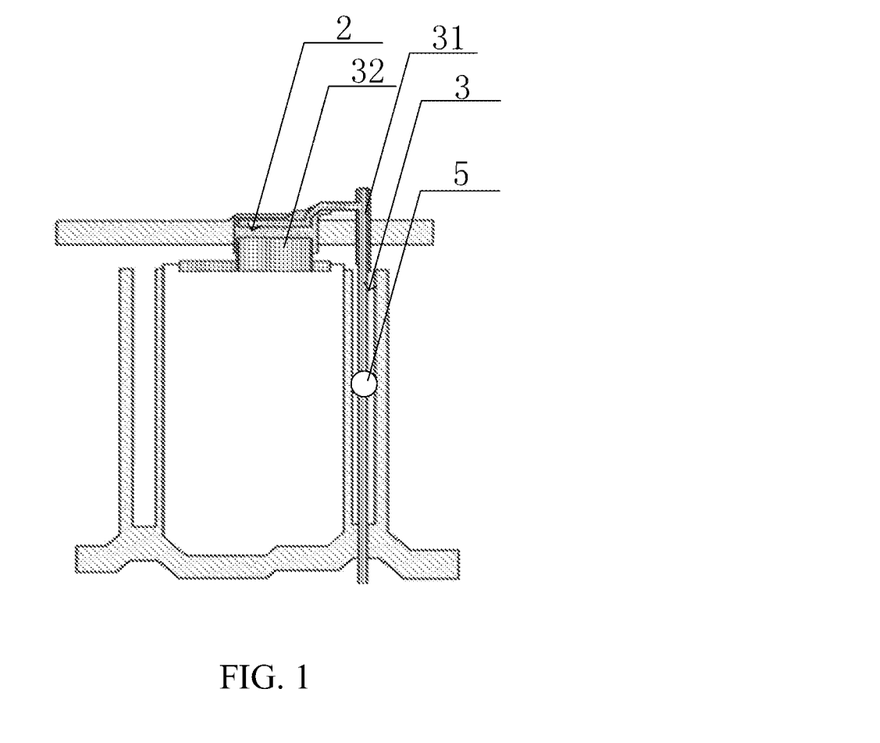
FIG. 1 is a cross-sectional schematic view of a display panel designed by an inventor of an embodiment of the disclosure.
Figure 2:
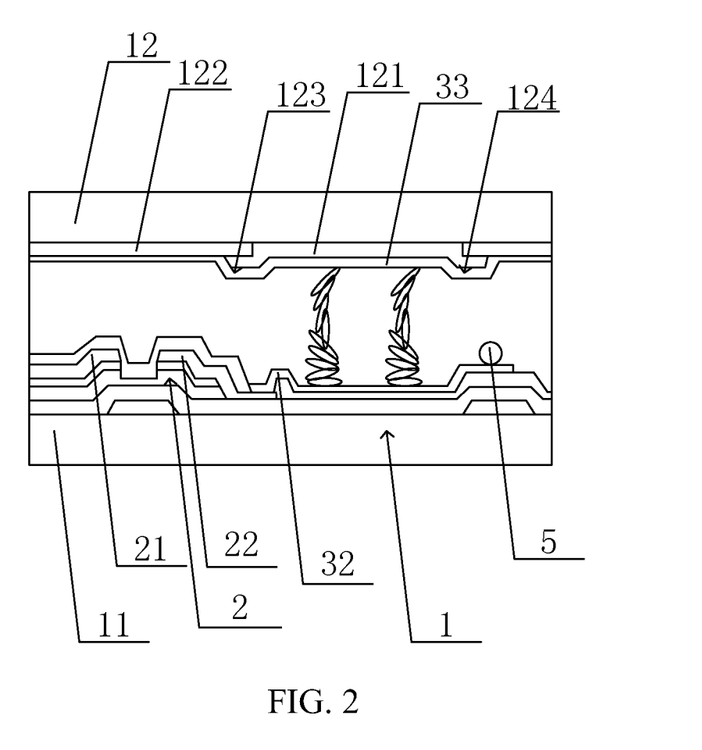
FIG. 2 is a cross-sectional schematic view of a display panel according to another embodiment of the disclosure.

As shown in FIG. 1 and FIG. 2, the inventor designs an unpublished display panel. The display panel includes a substrate 1, active switches 2 and protective layer. The active switches 2 are disposed with metallic wires 3 and the active switches 2 are connected with the metallic wires 3. The metallic wires 3 are disposed on the substrate 1. The disposition can effectively save materials and further reduce costs in production, as well as decreasing the thickness of the display panel. The convexity disposed on the substrate 1 has a separate function.

According to the further study of the inventor, particles 5 may drop on the metallic wires 3 in subsequent processes, or after aligning the substrate 1. In the process of manufacturing panels, particles can be dropped on metallic wires to be flaws of the metallic wires, further becoming flaws or displacement of the metallic wires 3 during pressing the panel, but the particles 5 may not be wholly picked out in the production line due to the height, and the problem of complaints from clients frequently occurs. Therefore, the inventor provides a new display panel to prevent the flaw of the metallic wires 3.

The disclosure will be further illustrated with reference to FIG. 3 to FIG. 7 and preferred embodiments as follows.

The display panel includes the substrate 1, the active switches 2 disposed on the substrate 1, the metallic wires 3 disposed on the active switches 2, and a blocker 4 disposed on the metallic wires 3. The active switches 2 and the metallic wires 3 are connected. The blocker 4 is configured to block the particles 5 from dropping on the metallic wires 3 in the process of manufacturing display panels.

The disposition of the blocker 4 can effectively prevent the particles 5 dropped on the metallic wires 3 in the manufacturing process of display panels, better in preventing the particles 5 dropped on the metallic wires 3 from being pressed out. The height of the blocker 4 is greater than the height of the particles 5 for preventing flaws or displacement of the metallic wires 3 due to the particles 5 during pressing the panel. The ratios of flaws or displacement of the metallic wires 3 can be reduced and the display quality of the display panel is efficiently improved for guaranteeing the better display effect of the display panel. A cross-section of the blocker 4 is disposed to be trapeziform or triangular to enable the particles 5 to roll away from the metallic wires 3 along a side of the blocker 4. The metallic wires 3 is protected and the yield of the display panels is further raised. The risk of complaints from clients can be reduced and the competitive strength of the display panel on the market can be improved effectively.

Figure 3:
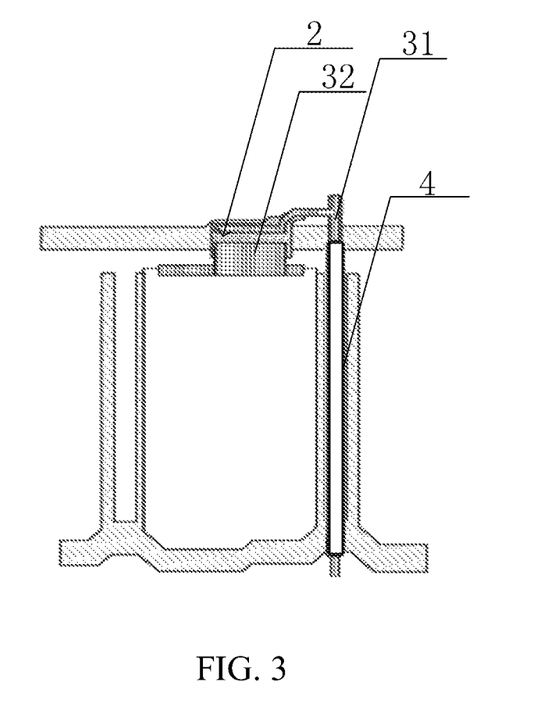
FIG. 3 is a cross-sectional schematic view of a display panel according to another embodiment of the disclosure.

As shown in FIG. 3, each of the active switches 2 includes a source electrode 21. The metallic wires 3 include a data line 31. The data line 31 and the source electrode 21 are connected. The blocker 4 is disposed on the data line 31 to protect the data line 31 effectively by preventing the particles 5 from dropping on the metallic wires 3 in manufacturing the display panel or after aligning the display panel, further avoiding flaws or displacement of the data line 31 caused by the particles 5 during pressing the panel. As a result, the ratio of appearances of flaws or displacement of the data line 31 can be significantly decreased and problems such as dark spots on the display panel due to the inferior data line 31 can be effectively precluded. The quality of the display panel can be improved to ensure better display effects of the display panel. The enhanced yield of the display panels can reduce the risk of complaints from clients and promote the competitive strength of the display panel on the market.

The blocker 4 is disposed to be closely clung to an upper surface of the data line 31. An end of the blocker 4 contacted with the upper surface of the data line 31 thoroughly covers the upper surface of the data line 31 to prevent the poor display effect caused by the particles 5 dropped on the data line 31. The excellent protection can prevent the data line 31 from being damaged in subsequent processes and further raise the yield of the display panels to guarantee the quality of the display panel. As a result, the risk of complaints from clients can be reduced and the competitive strength of the display panel on the market can be improved effectively.

Figure 4:
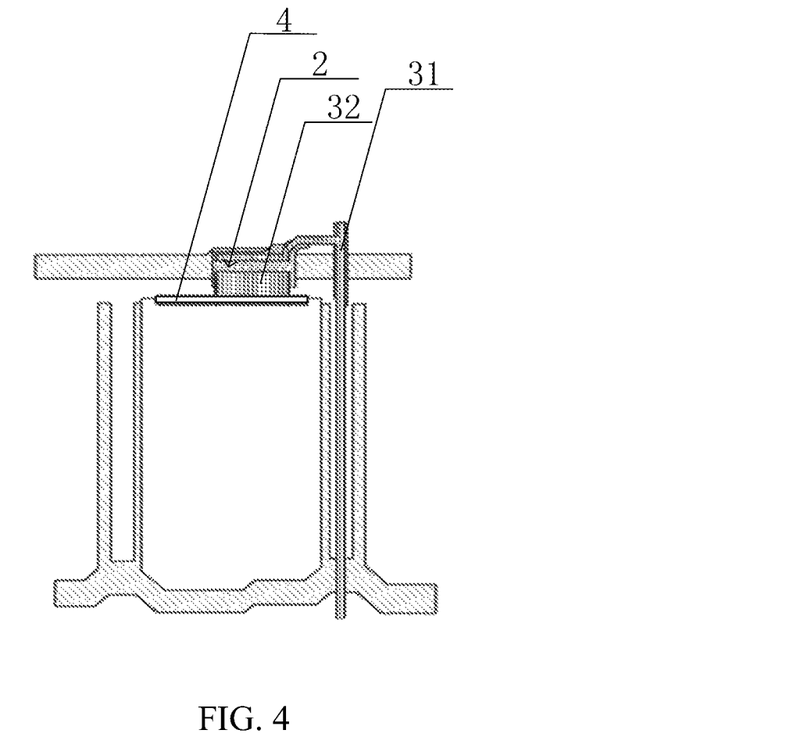
FIG. 4 is a cross-sectional schematic view of a display panel according to another embodiment of the disclosure.

As shown in FIG. 4, each of the active switches 2 includes a drain electrode 22. The metallic wires 3 include a pixel line 32. The pixel line 32 and the source electrode 21 are connected. The blocker 4 is disposed on the data line 31 to effectively protect the pixel line 32 by preventing the particles 5 dropped on the pixel line 32 from being pressed out. Not only can avoid the poor display effect caused by the particles 5 dropped on the pixel line 32, but the excellent protection acts to prevent the pixel line 32 from being damaged in subsequent processes and further raise the yield of the display panels to guarantee the better display effect of the display panel. As a result, the risk of complaints from clients can be reduced and the competitive strength of the display panel on the market can be improved effectively.

The blocker 4 is disposed to be closely clung to an upper surface of the pixel line 32, and the blocker 4 is disposed along an edge of the pixel line 32. The block 4 is disposed to surround the pixel line 32 to effectively block the particles 5 and reduce a ratio of the particles 5 dropped in a liquid crystal cell for ensuring proper and efficient operation of the liquid crystal, and the height of the blocker 4 is greater than the height of the particles 5 for preventing flaws or displacement of the pixel line 32 due to the particles 5 during pressing the panel. The ratios of flaws or displacement of the pixel line 32 can be reduced and the display quality of the display panel is improved efficiently for guaranteeing the better display effect of the display panel.

Figure 5:
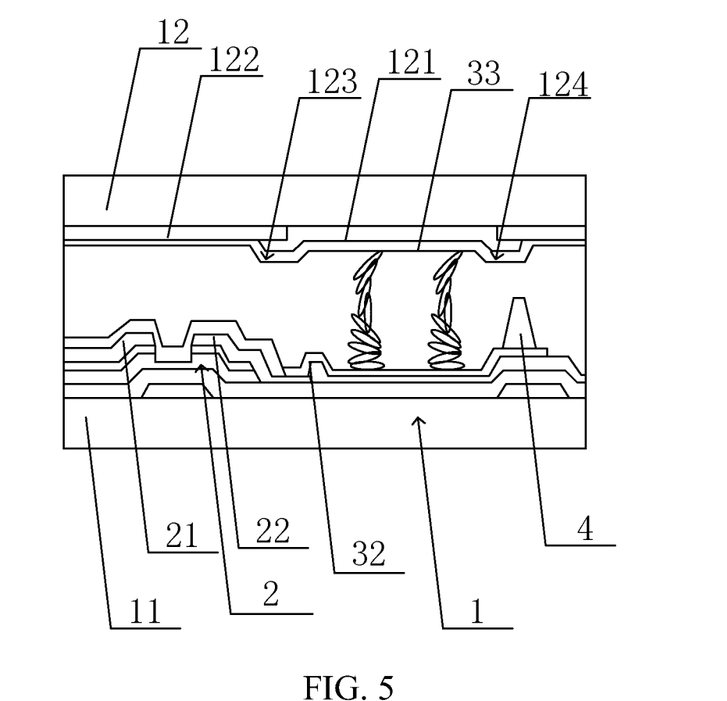
FIG. 5 is a cross-sectional schematic view of a display panel according to another embodiment of the disclosure.

As shown in FIG. 5, the substrate 1 include a first substrate 11 and a second substrate 12. A layer of liquid crystal (LC) molecules are interposed between the first substrate 11 and the second substrate 12. The display panel alters the polarization state of light by control of the electric field on the orientation of liquid crystal molecules, and achieves the objective of display by blocking or unblocking the optical path by a polarizer. The active switches 2 are disposed on the first substrate 11. The second substrate 12 is disposed with a color photoresist layer 121 and a black matrix 122. The disposition of the black matrix 122 can effectively prevent light leakage and cross color of the color photoresist layer, and the display panel can display splendidly. The color saturation of the display panel is improved to further enhance the display effect of the display panel. The black matrix 122 is disposed on two ends of the color photoresist layer 121 to shade the rays of the color photoresist layer 121. The light leakage of the display panel can be prevented to ensure the better display effect of the display panel.

The metallic wires include a driving line 33. The driving line 33 and the pixel line 32 are matched with each other. The driving line 33 is disposed on the color photoresist layer. The blocker 4 is disposed on the driving line 33 to effectively protect the driving line 33 by preventing the particles 5 dropped on the driving line 33 from being pressed out. Not only can avoid the poor display effect caused by the particles 5 dropped on the driving line 33, but the excellent protection acts to prevent the driving line 33 from being damaged in subsequent processes and further raise the yield of the display panels to guarantee the better display effect of the display panel. As a result, the risk of complaints from clients can be reduced and the competitive strength of the display panel on the market can be improved effectively.

Figure 6:
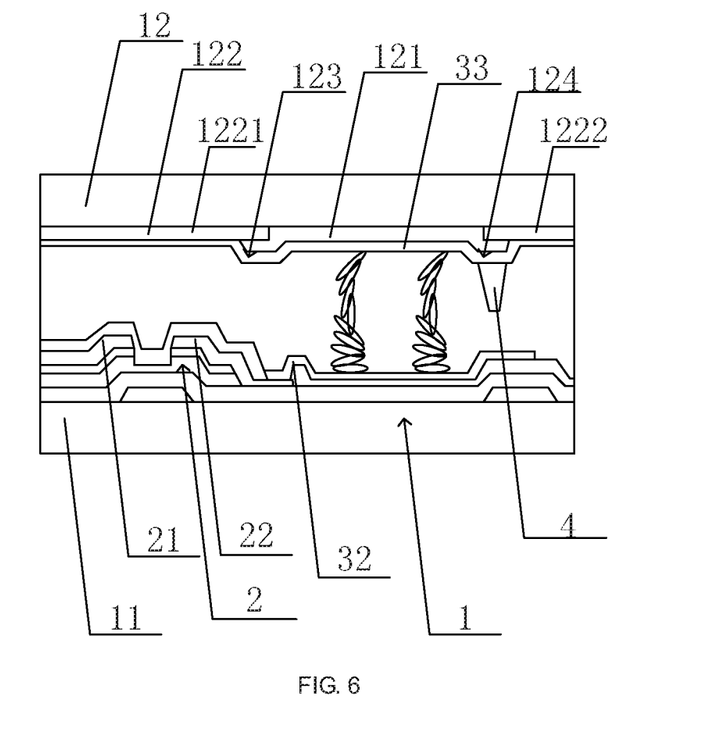
FIG. 6 is a cross-sectional schematic view of a display panel according to another embodiment of the disclosure.

As shown in FIG. 6, the two ends of the color photoresist layer 121 are disposed to be attached to the black matrix 122 to form a first convex platform 123 and a second convex platform 124. Specifically, the black matrix 122 includes a first portion 1221 and a second portion 1222, the color photoresist layer 121 is substantially disposed between the first portion 1221 and the second portion 1222 while the two ends of the color photoresist layer 121 are respectively disposed on the first portion 1221 and the second portion 1222, thereby forming the first convex platform 123 and the second convex platform 124. The blocker 4 is disposed on the first convex platform 123 and/or the second convex platform 124. As the first convex platform 123 and the second convex platform 124 have the function of separation, the disposition of the blocker 4 on the first convex platform 123 and/or the second convex platform 124 can further improve the separation effect and effectively prevent the particles 5 dropped in the liquid crystal cell; so that the display effect of the liquid crystal panel can be assured. The risk of complaints from clients is reduced and the competitive strength of the display panel on the market is promoted.

Figure 7:
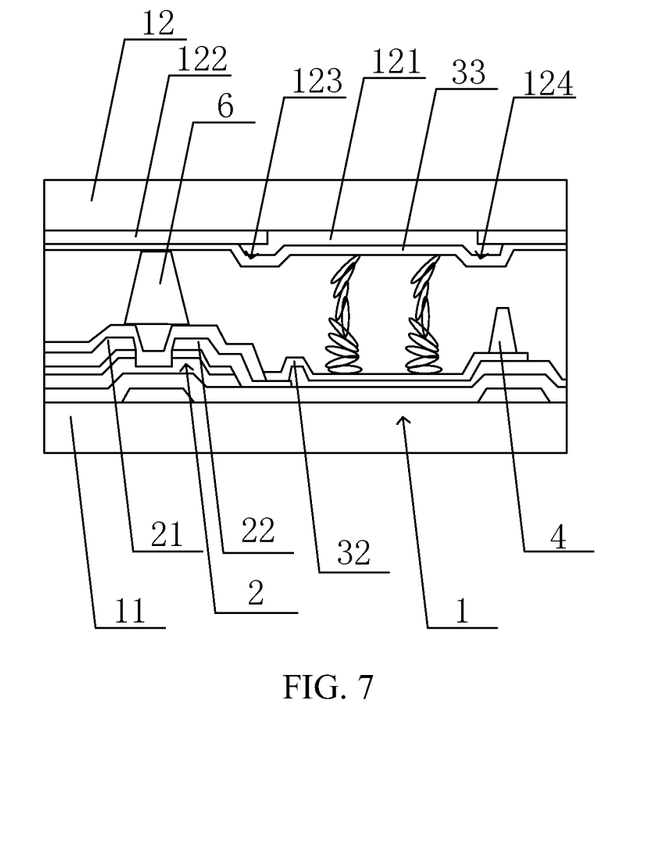
FIG. 7 is a cross-sectional schematic view of a display panel according to another embodiment of the disclosure.

As shown in FIG. 7, a spacer 6 is disposed between the first substrate 11 and the second substrate 12. The blocker 4 is disposed on the pixel line 32 and is opposite to the second convex platform 124. The spacer 6 supports the first substrate 11 and the second substrate 12 to assure the proper operation of the liquid crystal in the liquid crystal cell. The colors and the brightness of the display panel can be more even. The display effect of the display panel and the competitive strength of the product can both be improved.

The spacer 6 and the blocker 4 are both made out of photoreaction materials. As the photoreaction materials have hardness over 3H to offer pretty good support, the liquid crystal in the liquid crystal cell can work properly to improve uniformity of the colors and the brightness of the display panel, resulting in the better display effect of the display panel. And the influence on the active switches 2 can be reduced to prevent the dark spots. The display effect of the display panel is better, and the display quality of the display panel is accordingly better; the photoreaction materials have superior thermal resistance and chemical corrosion resistance to ensure proper operation of the display panel as well as the quality of the display panel; the spacer 6 has extremely high transmittance and contrast ratio to enhance the uniformity of the colors and the brightness of the display panel, as well as the quality of the display panel; the spacer 6 and the ITO thin film layer are pasted, so that the spacer 6 can be securely fixed to avoid the movement of the spacer 6 and assure the proper operation of the liquid crystal in the liquid crystal cell. The colors and the brightness of the display panel can be more even. The display effect of the display panel and the competitive strength of the product can both be improved; the photoreaction materials are photosensitive polymer resin mixtures, and the preparation method thereof is coating the photoreaction materials on the ITO thin film layer, after steps such as exposure, development, toasting, etc. until the required thickness and shape of the spacer 6 is achieved, subsequently directly attaching the substrate 1 with the spacer 6 to the other substrate to form the liquid crystal cell between the two substrates; controlling the shape of the spacer 6 by the photoetching process, and controlling the thickness and shape of the spacer 6 by controlling the shape of the photomask and the time for illumination. The spacer 6 can provide enough support to prevent the deformation of the active switches 2 caused by the external force loaded on the spacer 6 in following processes, and the influence on the electrical property of active switches 2 can be reduced. The appearance of the dark spots is likewise prevented to some extent. The display effect and the display quality of the display panel can be better.

The spacer 6 and the blocker 4 adopt an identical photomask to simplify the manufacturing process of the display panel. The manufacturing process of the display panel can be simplified by producing the spacer 6 and the blocker 4 simultaneously. The production of the display panel can be more convenient. The mere improvement in the conventional photomask for producing the spacer 6 is enough for producing the blocker 4 and the spacer 6 with similar costs simply and conveniently, and the quality of the display panel can be improved; controlling the shapes of the spacer 6 and the spacer 4 by the photoetching process as well as controlling the thicknesses and shapes of the spacer 6 and the spacer 4 by controlling the shape of the photomask and the time for illumination. The spacer 6 can provide enough support, and the spacer 4 can provide enough separation; and the spacer 6 prevents the deformation of the active switches 2 caused by the external force loaded on the spacer 6 in following processes, and the influence on the electrical property of active switches 2 can be reduced. The appearance of the dark spots is likewise prevented to some extent. The display effect and the display quality of the display panel can be better; the blocker 4 can effectively prevent the particles 5 dropped on the metallic wires 3 in the manufacturing process of display panels, further preventing the particles 5 dropped on the metallic wires 3 from being pressed out for reducing the ratio of appearance of flaws or displacement of the metallic wires 3, and the display quality of the display panel is improved efficiently for guaranteeing the better display effect of the display panel.

Each of the active switches 2 includes a gate electrode. The gate electrode is disposed on the substrate 1. The gate electrode is disposed with an insulating layer. A semiconductor layer is disposed on the insulating layer correspondingly to the gate electrode. Two ends of the semiconductor layer are separately disposed with the source electrode 21 and the drain electrode 22 of the thin film transistor. A groove is defined between the source electrode 21 and the drain electrode 22. The bottom of the groove is the semiconductor layer.

The spacer 6 is disposed across the groove, so that the spacer 6 can provide effective support on two ends of the groove, and the spacer 6 can be more securely disposed on the support layer for preventing the movement of the spacer 6 and assuring the proper operation of the liquid crystal in the liquid crystal cell. The colors and the brightness of the display panel can be more even. The display effect of the display panel and the competitive strength of the product can both be improved; the cross-section of the spacer 6 is quadrilateral to effectively prevent the spacer 6 from rolling, and the spacer 6 can be securely fixed on the active switches 2 to prevent defective pixels and the damage of the color filter. The color filter is well protected and the durability of the display panel has been improved. The display panel can serve for longer.

A width of an end of the spacer 6 contacted with the support layer is greater than a width of the other end, in other words, the bottom of the spacer 6 is wider than the top thereof. The production of the gate electrode is more convenient. The formation is more stable and the yield is higher. The contact area of the bottom of the spacer 6 is larger to achieve the better adhesive effect, and the fixation of the spacer 6 is fastened. The cross-section of the spacer 6 is preferred to be trapezoid, especially isosceles trapezoid, as a result, extrusion on the active switches 2 due to the external force loaded on the spacer 6 can be reduced in subsequent processes such as the partial paste process/thinning process/pressing test to guarantee the good electrical property of the active switches 2, and the dark spots are significantly decreased.

According to another aspect of the disclosure, the disclosure further discloses a display device. The display device includes the previous display panel. The specific structure and the connection of the display panel can be referred to FIG. 1 to FIG. 7 without repeated description in detail.

In the embodiment above, the material of the substrate 1 can be glass, plastic, etc.

In the embodiment above, the display panel can be a liquid crystal panel, a plasma panel, etc. Taking the liquid crystal panel as an example, the liquid crystal panel includes an array substrate and a color filter (CF) substrate. The array substrate and the color filter substrate are disposed opposite. The liquid crystal is disposed between the array substrate and the CF substrate. The array substrate is disposed with a thin film transistor (TFT). The CF substrate is disposed with a color filter layer.

In the embodiment above, the CF substrate can include the TFT array. The color film and the TFT array can be formed on the same substrate. The array substrate can include the color filter layer.

In the embodiment above, the display panel of the disclosure can be a curved panel.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A display device, the display device comprising a backlight module and a display panel, the display panel comprising:
a first substrate;
active switches, disposed on the first substrate,
wherein the active switches are connected to metallic wires, the metallic wires have a blocker disposed thereon,
wherein the blocker is made of a photoreaction material,
wherein each of the active switches comprises a source electrode, the metallic wires comprise a data line, the data line and the source electrode are connected, and the blocker is disposed on the data line and is in contact with an upper surface of the data line, and
wherein each of the active switches comprises a drain electrode, the metallic wires comprise a pixel line, the pixel line and the source electrode are connected.

2. The display device according to claim 1, wherein the metallic wires comprise a driving line, the driving line and the pixel line are matched with each other.

3. The display device according to claim 1, wherein the display device further comprises a second substrate opposite to the first substrate.

4. The display device according to claim 3, wherein a spacer is disposed between the first substrate and the second substrate, the spacer supports the first substrate and the second substrate, the spacer and the blocker are both made of a photoreaction material.

5. The display device according to claim 1, wherein a cross-section of the blocker is trapeziform.

6. A display panel, comprising:
a first substrate;
active switches, disposed on the first substrate; and
a second substrate, disposed opposite to the first substrate;
wherein the active switches are connected to metallic wires, the metallic wires have a blocker disposed thereon,
wherein the second substrate is provided with a color photoresist layer and a black matrix, the black matrix comprises a first portion and a second portion, the color photoresist layer is substantially disposed between the first portion and the second portion while two ends of the color photoresist layer are respectively disposed on the first portion and the second portion, thereby forming a first convex platform and a second convex platform;
wherein the metallic wires comprise a driving line disposed on the color photoresist layer, and the blocker is disposed on the driving line and on the second convex platform.

7. The display panel according to claim 6, wherein a spacer is disposed between the first substrate and the second substrate, the spacer supports the first substrate and the second substrate, the spacer and the blocker are both made of a photoreaction material.

8. The display panel according to claim 6, wherein each of the active switches comprises a drain electrode, the metallic wires comprise a pixel line, the pixel line and the source electrode are connected with each other.

9. The display panel according to claim 6, wherein each of the active switches comprises a source electrode, the metallic wires comprise a data line, the data line and the source electrode are connected with each other.

10. The display panel according to claim 6, wherein the metallic wires comprise a pixel line, the driving line and the pixel line are matched with each other.

11. The display panel according to claim 6, wherein a cross-section of the blocker is trapeziform.

12. A display panel, comprising:
a first substrate;
active switches, disposed on the first substrate;
wherein the active switches are connected to metallic wires, the metallic wires have a blocker disposed thereon; each of the active switches comprises a source electrode and a drain electrode, the metallic wires comprise a pixel line, the pixel line and the source electrode are connected with each other, the blocker is disposed on the pixel line and clung to an upper surface of the pixel line, and the blocker is disposed along an edge of the pixel line; and
a second substrate, disposed opposite to the first substrate;
wherein a spacer is disposed between the first substrate and the second substrate, the spacer and the blocker are both made of a photoreaction material;
wherein a groove is defined between the source electrode and the drain electrode, the spacer is disposed on the source electrode and the drain electrode and is above the groove.

13. The display panel according to claim 12, wherein a color photoresist layer and a black matrix are disposed on the second substrate, the black matrix comprises a first portion and a second portion, the color photoresist layer is substantially disposed between the first portion and the second portion while two ends of the color photoresist layer are respectively disposed on the first portion and the second portion, thereby forming a first convex platform and a second convex platform, the blocker is opposite to the second convex platform.

14. The display panel according to claim 12, wherein a bottom of the spacer is wider than a top of the spacer.

15. The display panel according to claim 12, wherein a cross-section of the blocker is trapeziform.

* * * * *